United States Patent
Kinzer

(10) Patent No.: US 7,821,032 B2
(45) Date of Patent: Oct. 26, 2010

(54) III-NITRIDE POWER SEMICONDUCTOR DEVICE

(75) Inventor: Daniel M Kinzer, El Segundo, CA (US)

(73) Assignee: International Rectifier Corporation, El Segundo, CA (US)

(*) Notice: Subject to any disclaimer, the term of this patent is extended or adjusted under 35 U.S.C. 154(b) by 0 days.

(21) Appl. No.: 11/698,371

(22) Filed: Jan. 26, 2007

(65) Prior Publication Data

US 2008/0179631 A1 Jul. 31, 2008

(51) Int. Cl.
*H01L 31/0328* (2006.01)
(52) U.S. Cl. .................. 257/192; 257/183; 257/194; 257/E29.246; 257/E29.252; 257/E21.371; 257/E21.387; 257/E21.403; 257/E21.407
(58) Field of Classification Search .......... 257/E33.025, 257/E33.028, E33.033, E33.034, E29.246, 257/E29.252, E21.403, E21.407, 183, 192, 257/194, E21.371, E21.387

See application file for complete search history.

(56) References Cited

U.S. PATENT DOCUMENTS

| | | | | |
|---|---|---|---|---|
| 7,038,252 B2* | 5/2006 | Saito et al. | ................... | 257/192 |
| 2004/0157355 A1* | 8/2004 | Kachi et al. | ................... | 438/46 |
| 2005/0145883 A1* | 7/2005 | Beach et al. | ................. | 257/194 |
| 2005/0258450 A1* | 11/2005 | Saxler | ......................... | 257/192 |
| 2006/0065912 A1* | 3/2006 | Beach | ......................... | 257/194 |
| 2007/0114567 A1* | 5/2007 | Matocha et al. | .............. | 257/192 |
| 2007/0176201 A1* | 8/2007 | Beach et al. | ................. | 257/192 |

FOREIGN PATENT DOCUMENTS

JP 7-231085 A 9/2007

* cited by examiner

*Primary Examiner*—Kenneth A Parker
*Assistant Examiner*—Jay C Kim
(74) *Attorney, Agent, or Firm*—Farjami & Farjami LLP

(57) ABSTRACT

An enhancement mode III-nitride power semiconductor device that includes normally-off channels along the sidewalls of a recess and a process for fabricating the same, the device including a first power electrode, a second power electrode, and a gate disposed between the first power electrode and the second power electrode over at least a sidewall of the recess.

18 Claims, 3 Drawing Sheets

III-NITRIDE POWER SEMICONDUCTOR DEVICE

BACKGROUND OF THE INVENTION

The present invention relates to a III-Nitride power semiconductor device and a method for fabrication thereof.

III-nitride power semiconductor devices are commercially desirable due to their high band gap and high current carrying capabilities.

A typical III-nitride power semiconductor device, for example, a III-nitride high electron mobility transistor (HEMT), includes a III-nitride heterojunction which serves as a current conduction channel between two power electrodes. Specifically, a HEMT according to the prior art includes a first III-nitride semiconductor body, which may be composed of, for example, undoped GaN, and a second III-Nitride semiconductor body, which may be composed of, for example, N-type AlGaN, disposed over the first semiconductor body. The first semiconductor body may be formed over a transition body composed, for example, of AlN, which is itself formed over a substrate.

As is well known, the heterojunction of the first semiconductor body and the second semiconductor body results in the formation of a carrier-rich conductive region usually referred to as a two dimensional electron gas or 2DEG. Current may be conducted between a first ohmic contact (which is ohmically coupled to second semiconductor body), and a second ohmic contact (which is also ohmically coupled to second semiconductor body) through the 2DEG.

A conventional HEMT, is a normally ON device. In many applications it is desirable to turn the device off or have a normally OFF device. Thus, a gate electrode may be disposed between the first ohmic contact and the second ohmic contact. The application of an appropriate voltage to the gate electrode causes the interruption of the 2DEG thereby turning the device OFF. Thus, to operate a conventional HEMT as a normally OFF device requires the continued application of a voltage to the gate electrode, which is not desirable as it consumes more energy, and may also require a more complicated drive circuitry compared to a normally OFF device.

SUMMARY OF THE INVENTION

It is an object of the present invention to provide an enhancement mode (normally off) III-nitride power semiconductor device.

III-nitride as referred to herein refers to any undoped or doped semiconductor alloy from the InAlGaN system, including, for example, AlN, AlGaN, GaN, InAlGaN, InGaN, and any combination thereof.

U.S. application Ser. No. 11/232,646, which is assigned to the assignee of the present invention, discloses a normally off III-nitride power semiconductor device that includes a first III-nitride semiconductor body, a second III-nitride semiconductor body over the first III-nitride semiconductor body forming a heterojunction body, the heterojunction body including a first portion, a second portion, and a third portion sloping at an angle between the first portion and the second, whereby the 2DEG resulting from the heterojunction of the two III-nitride semiconductor bodies is interrupted by the third sloping portion. A device according to the present invention further includes a first power contact electrically coupled to the first portion of the heterojunction body, a second power contact electrically coupled to the second portion of the heterojunction body, and a gate structure coupled to the third portion of the heterojunction body.

A device according to the preferred embodiment of the present invention includes a semiconductor body having a first III-nitride semiconductor layer of N-type conductivity, a second III-nitride semiconductor layer of P-type conductivity formed on the first layer and a recess extending through the second layer and terminating in the first layer, a III-nitride active heterojunction body extending from at least the first layer along a sidewall of the recess to the second layer, the active heterojunction including a first III-nitride body having one band gap and a second III-nitride body having another band gap formed over the first III-nitride body, a first power electrode electrically coupled to the III-nitride active heterojunction, and disposed at least partially over the second layer, a second power electrode electrically coupled to the III-nitride heterojunction and disposed over the first layer, a control electrode coupled to the heterojunction and disposed between the first power electrode and the second power electrode.

According to one aspect of the present invention, the second III-nitride semiconductor body, which is P type is grown, for example, epitaxially. Growing the second III-nitride layer as opposed to implanting a III-nitride body with P type dopants is advantageous in that P type implantation creates defects, which become N type, making it difficult to devise an enhancement type device.

Other features and advantages of the present invention will become apparent from the following description of the invention which refers to the accompanying drawings.

BRIEF DESCRIPTION OF THE DRAWING(S)

DETAILED DESCRIPTION OF EMBODIMENTS OF THE INVENTION

Figure 1:
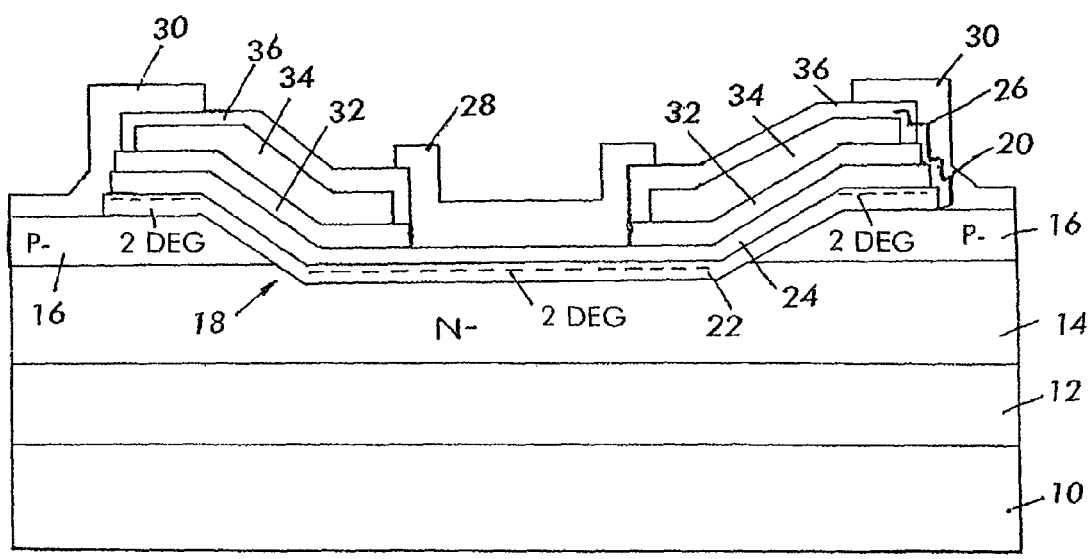
FIG. 1 illustrates a cross-sectional view of a III-nitride semiconductor device according to the preferred embodiment of the present invention.

Referring to FIG. 1, a device according to the preferred embodiment of the present invention includes substrate 10, transition layer 12 disposed on substrate 10, III-nitride buffer layer 14 of one conductivity (e.g. N-type) on transition layer 12, and III-nitride layer 16 of another conductivity opposite to the one conductivity (e.g. P-type) on buffer layer 14. A recess 18 extending from the top and through III-nitride layer 16 and terminating inside buffer layer 14 receives III-nitride heterojunction 20, which extends from one top surface of layer 16, along the sidewalls and the bottom of recess 18 to another top surface of m-nitride layer 16. Heterojunction 20 includes a III-nitride body 22 having one band gap and another III-nitride body 24 having another, different band gap. The differences in the band gaps of body 22, and body 24 are selected to result in the formation of a 2DEG at the heterojunction of the two bodies 22, 24 that is generally horizontally oriented. Specifically, heterojunction 20 includes a 2DEG along the portions thereof overlying layer 16 and buffer layer 14 at the bottom of recess 18. Portions of heterojunction 20 overlying the sloping sidewalls of recess 18 do not include a 2DEG.

According to one aspect of the present invention, a gate structure 26 is disposed over at least each portion of heterojunction 20 that overlies a respective sidewall of recess 18, which, upon application of an appropriate voltage, serves to attract electrons to the heterojunction along the sloping sidewalls of recess 18 to restore the 2DEG, whereby uninterrupted conductive channel is formed in the heterojunction capable of carrying a current. The current may be carried from one power electrode 28 (e.g. drain electrode), which is preferably coupled ohmically to the portion of heterojunction 20 overlying the bottom of recess 18, to another power electrode 30 (e.g. source electrode), which is preferably ohmically coupled to a portion of heterojunction overlying layer 16 at the top of recess 18. Note that according to the one aspect of the present invention each power electrode 30 is ohmically coupled also to layer 16.

In the preferred embodiment of the present invention, a gate structure includes gate insulation 32, and gate electrode 34. Preferably, gate insulation 32 begins from a top portion of heterojunction 20 overlying a top surface of layer 16 along the sidewalls and the bottom of recess 18 and ends at another top portion of heterojunction 20. Furthermore, preferably, each gate electrode 34 includes a portion over the top surface of heterojunction 20 and another portion overlying a bottom portion of heterojunction 20 at the bottom of recess 18 as seen in FIG. 1. An insulation body 36 covers each gate electrode 34. Preferably, a portion of each power electrode 30 and a portion of power electrode 28 extends over a corresponding portion of an insulation body 36 as illustrated by FIG. 1. Note that, alternatively, gate structure 34 may be formed without an insulation body, but with a conductive body that makes schottky contact with the heterojunction.

Figure 2:
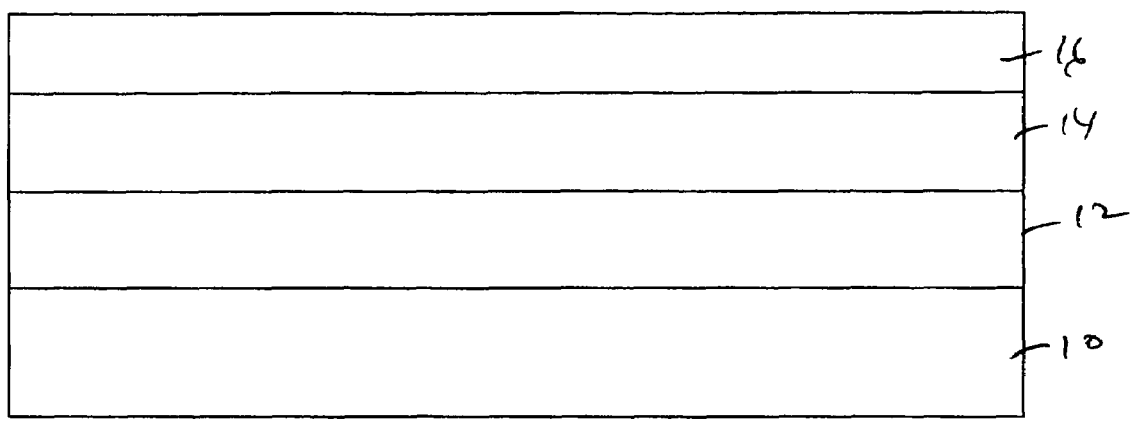
FIGS. 2 and 3 illustrate selected steps in a process for fabricating a III-nitride device according to the preferred embodiment of the present invention.
Figure 3:
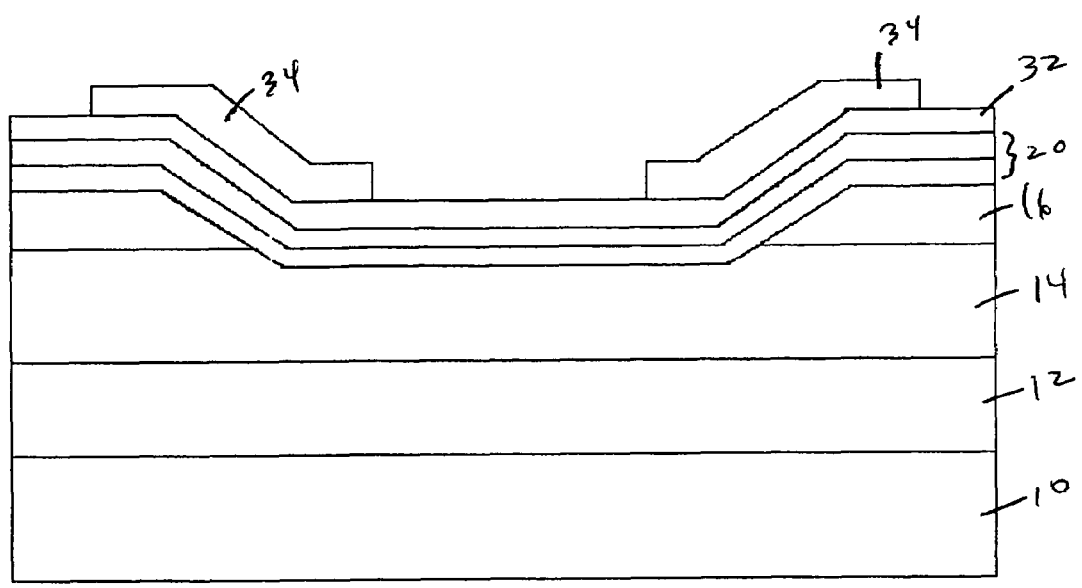

Referring to FIGS. 2 and 3, a device according to the present invention is fabricated by forming on substrate 10 transition layer 12, buffer layer 14, and III-nitride layer 16. Note that according to one aspect of the present invention III-nitride layer 16, which may be P type, is grown, for example, epitaxially, whereby defects due to implantation may be avoided.

In the preferred embodiment of the present invention, substrate 10 is formed of silicon, transition layer 12 may be formed with graded or uniform AlN, buffer layer may be formed with N-type GaN and layer 16 may be formed with P-type GaN. Instead of silicon, substrate 10 may be formed from, for example, SiC, Sapphire, or III-nitride-based material such as GaN. In the event, a GaN substrate is used it may be possible to eliminate transition layer 12.

Referring to FIG. 3, recess 18 is formed through III-nitride layer 16 and into buffer layer 14, heterojunction 20 is formed over the structure so obtained and gate insulation 32 is formed over heterojunction 20. Thereafter, material for forming gate electrodes 34 is formed on insulation 32 and patterned to obtain gate electrode 34. Then, gate electrodes 34 are covered with insulation and patterned to form insulation bodies 36. Power electrodes 28 and 30 are then formed to obtain a device according to the present invention. Note that a portion of gate insulation 32 and heterojunction 20 must also be removed to allow electrodes 30 to make ohmic contact with layer 16.

Gate insulation layer 32 and insulation bodies 36 may be composed of $SiO_2$, $Si_3N_4$, diamond, or any other suitable gate insulation, and power electrodes 28,30 and gate electrodes 34 may be composed of any suitable material such as Ti/Al, Ni/Au, Hf, Si, or other Si containing alloys.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A semiconductor device, comprising:
   a semiconductor body having a first III-nitride semiconductor layer of N-type conductivity, a second III-nitride semiconductor layer of P-type conductivity formed over said first III-nitride semiconductor layer and a recess extending through said second III-nitride semiconductor layer and terminating in said first III-nitride semiconductor layer;
   a III-nitride active heterojunction body extending from at least said second III-nitride semiconductor layer along a sidewall of said recess and including a portion that directly overlies said first III-nitride semiconductor layer at a bottom of said recess, said III-nitride active heterojunction body including a first III-nitride body having one band gap and a second III-nitride body having, another band gap formed over said first III-nitride body;
   a first power electrode electrically coupled to said III-nitride active heterojunction body, and disposed at least partially over said second III-nitride semiconductor layer;
   a second power electrode disposed directly over and electrically coupled to said portion of said III-nitride active heterojunction body directly overlying said first III-nitride semiconductor layer at said bottom of said recess and disposed over said first III-nitride semiconductor layer;
   a control electrode coupled to said III-nitride active heterojunction body and disposed between said first power electrode and said second power electrode;
   wherein a voltage applied to said control electrode is used to control a current flowing between said first power electrode and said second power electrode.

2. The semiconductor device of claim 1, wherein said control electrode is capacitively coupled to said III-nitride active heterojunction body through a dielectric body.

3. The semiconductor device of claim 1, wherein said control electrode is disposed along at least said sidewall of said recess.

4. The semiconductor device of claim 1, wherein said first power electrode is ohmically connected to said second III-nitride semiconductor layer.

5. The semiconductor device of claim 1, wherein said semiconductor body is formed over a III-nitride transition layer which is disposed over a substrate.

6. The semiconductor device of claim 5, wherein said transition layer is comprised of AlN, said first III-nitride semiconductor layer is comprised of N-type GaN, and said second III-nitride semiconductor layer is comprised of P-type GaN.

7. The semiconductor device of claim 6, wherein said substrate is comprised of silicon.

8. The semiconductor device of claim 6, wherein said substrate is comprised of GaN.

9. The semiconductor device of claim 6, wherein said substrate is comprised of SiC.

10. The semiconductor device of claim 6, wherein said substrate is comprised of Sapphire.

11. The semiconductor device of claim 1 wherein said first III-nitride body is comprised of GaN and said second III-nitride body is comprised of AlGaN.

12. The semiconductor device of claim 1, wherein said second III-nitride semiconductor layer is grown.

13. The semiconductor device of claim 1, wherein said second III-nitride semiconductor layer is free from N-type defects caused by implantation.

14. The semiconductor device of claim 1, wherein said first power electrode is a source electrode and said second power electrode is a drain electrode.

15. The semiconductor device of claim 1, wherein said control electrode is disposed at one side of said second power electrode and further comprising a third power electrode and another control electrode at another side of said second power electrode, wherein said another control electrode is disposed between said third power electrode and said second power electrode.

16. The semiconductor device of claim 15, wherein said control electrode and said another control electrode are dispersed over respective sidewalls of said recess.

17. The semiconductor device of claim 16, wherein said control electrode and said another control electrode are either capacitively coupled to said III-nitride active heterojunction body or make schottky contact with said III-nitride active heterojunction body.

18. The semiconductor device of claim 1, wherein said control electrode is covered by an insulation body and wherein a portion of said first power electrode and a portion of said second power electrode extend over said insulation body.

* * * * *